(12) United States Patent
Fernandez-Texon

(10) Patent No.: US 6,605,965 B1
(45) Date of Patent: Aug. 12, 2003

(54) DIFFERENTIAL WINDOW COMPARATOR

(75) Inventor: Francisco Fernandez-Texon, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/965,590

(22) Filed: Sep. 26, 2001

(51) Int. Cl.$^7$ ................................................ H03K 5/22
(52) U.S. Cl. ............................................. 327/74; 327/79
(58) Field of Search ........................... 327/58, 62, 63, 327/65, 68, 70, 74, 77, 89, 78–79, 359, 355, 356

(56) References Cited

U.S. PATENT DOCUMENTS

| | | | | |
|---|---|---|---|---|
| 4,051,446 A | * | 9/1977 | Owaki | 331/116 R |
| 4,691,304 A | * | 9/1987 | Hori et al. | 365/226 |
| 4,833,418 A | * | 5/1989 | Quintus et al. | 330/9 |
| 5,267,023 A | * | 11/1993 | Kawasaki | 332/123 |
| 5,311,085 A | * | 5/1994 | Pelgrom et al. | 327/199 |
| 5,963,062 A | | 10/1999 | Fujii | 327/74 |
| 6,029,060 A | * | 2/2000 | Ashby | 323/315 |

* cited by examiner

*Primary Examiner*—Timothy P. Callahan
*Assistant Examiner*—Linh Nguyen
(74) *Attorney, Agent, or Firm*—MacPherson Kwok Chen & Heid LLP

(57) ABSTRACT

A window comparator is disclosed having a $1^{st}$ and a $2^{nd}$ voltage input wherein the window comparator is fully differential with respect to the $1^{st}$ and $2^{nd}$ voltage inputs. Two differential pairs control the state of a zero-crossing comparator in response to the difference between the $1^{st}$ and $2^{nd}$ voltage inputs.

11 Claims, 3 Drawing Sheets

US 6,605,965 B1

DIFFERENTIAL WINDOW COMPARATOR

FIELD OF INVENTION

The invention relates generally to comparators, and more particularly to a differential window comparator.

BACKGROUND

A zero-crossing comparator is a common circuit element typically formed with a high-gain differential amplifier that receives two independent input voltages and produces an output voltage signal proportional to the voltage difference between the two inputs, amplified according to the high gain. Such comparators are known as fully differential and will go into positive or negative saturation depending upon the relative difference of the input voltages. In this fashion, the output voltage signal indicates which one of the input voltages is greater than the other.

A window comparator is a special type of comparator that may produce a saturated output if the absolute value of the difference between the two input signals exceeds a specified value. There are two threshold voltages for such a window comparator: one at the upper edge of the window and the other at the lower or most negative voltage. Typically, a window comparator may comprise two zero-crossing comparators, where one is for the positive threshold and the other is for the negative threshold, combined with an OR function. Such window comparators require a relatively large number of transistors. Alternatively, window comparators may use a single comparator coupled to "single-ended" differential stages to give a more compact design. However, the window comparator will then suffer from higher common mode noise sensitivity.

Accordingly, there is a need in the art for a compact design for a fully differential window comparator.

SUMMARY

In accordance with one embodiment of the invention, a window comparator is fully differential with respect to a first and a second voltage input. The window comparator includes a first differential pair, wherein a first transistor in the first differential pair is biased to conduct a first current and a second transistor in the first differential pair is biased to conduct the first current when the difference between the first input voltage and second input voltage equals a first voltage threshold. In addition, the window comparator includes a second differential pair, wherein a first transistor in the second differential pair is biased to conduct a second current and a second transistor in the second differential pair is biased to conduct the second current when the difference between the first input voltage and second input voltage equals a second voltage threshold. A zero-crossing comparator has a first input coupled to a first terminal on the first transistors in the first and second differential pairs and a second input coupled to a first terminal on the second transistors in the first and second fully differential pairs.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

DETAILED DESCRIPTION

Figure 1:
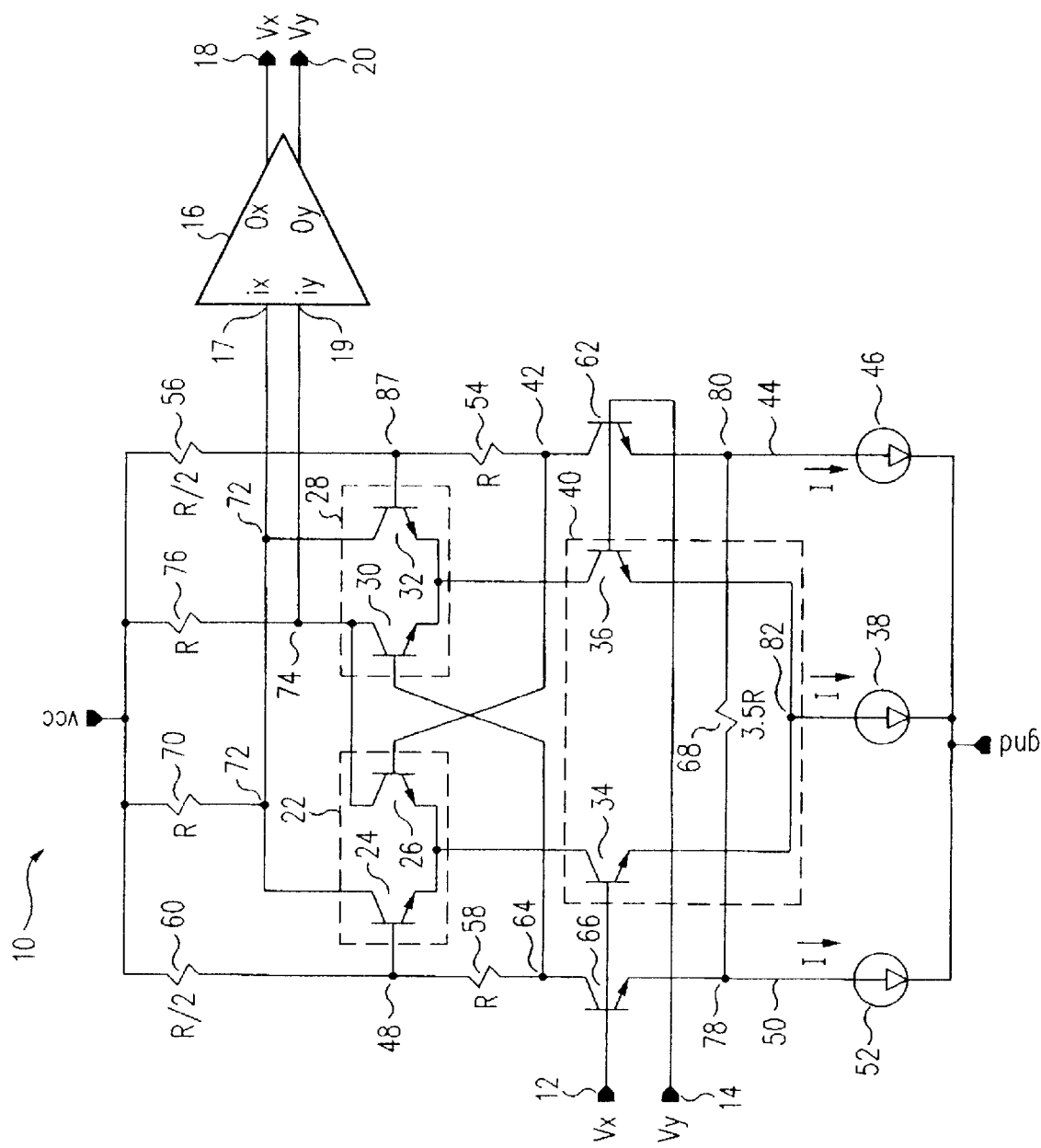
FIG. 1 is a schematic of a differential window comparator according to one embodiment of the invention.

Turning now to FIG. 1, a window comparator 10 in accordance with the invention is shown. Window comparator 10 has two inputs having voltages VX 12 and VY 14. As the difference between the input voltages VX 12 and VY 14 exceeds a threshold, a comparator 16 will change its binary state as determined by the voltage difference between its outputs (VX 18 minus VY 20). This voltage difference will be either high or low depending the relationship between voltage difference (VX 12 minus VY 14) to a first threshold voltage and to a second threshold voltage, wherein the first threshold voltage is greater than the second threshold voltage. Should the difference between input voltages VX 12 and VY 14 be less than the second threshold voltage, the difference between output voltages VX 18 and VY 20 will be high. In one embodiment, this high value equals 300 millivolts. As the difference between input voltages VX 12 and VY 14 is increased so as to exceed the second threshold voltage, the comparator 16 changes its binary state such that the difference between output voltages VX 18 and VY 20 will be low, e.g., −300 millivolts.

Should the difference between input voltages VX 12 and VY 14 continue to increase so as to exceed the first threshold voltage, the difference between output voltages VX 18 and VY 20 will again be high. It will be appreciated that a comparator having a single output with respect to ground could also be used in window comparator 10. Moreover, the binary response of comparator 16 may be reversed by switching the leads coupling to comparator inputs ix 17 and iy 19. The relationship between the input voltages VX 12 and VY 14 and the voltages at comparator 16 inputs ix 17 and iy 19 will now be explained.

The voltages at inputs ix 17 and iy 19 are controlled by a first differential pair 22 and a second differential pair 28. The first differential pair 22 includes matched bipolar NPN, transistors 24 and 26. Similarly, the second differential pair 28 includes matched bipolar transistors 30 and 32. The voltage of input ix 17 is determined by the voltage at the collector terminals of transistors 24 and 32 (node 72). The collector terminal voltage (node 74) of transistors 26 and 30 determines the voltage of input iy 19. In operation, just one of the differential pairs 22 and 28 will determine the voltages at inputs ix 17 and iy 19 in the following fashion.

The emitter terminals of transistors 24 and 26 in first differential pair 22 couple to a bipolar NPN transistor 34. Similarly, the emitter terminals of transistors 30 and 32 in second differential pair 28 couple to a bipolar NPN transistor 36 (matched to transistor 34). Transistors 34 and 36 form a third differential pair 40 supplying the current of value I to a current source 38 that couples to third differential pair 40 at a node 82. I is an arbitrary current value as will be explained further herein. Input voltage VX 12 biases the base terminal of transistor 34 and input voltage VY 14 biases the base terminal of transistor 36. Thus, should voltages VX 12 and VY 14 be equal, transistors 34 and 36 are equally biased so that each conducts a current of I/2. As is known for differential pairs, should one transistor's base terminal be biased by more than the thermal voltage $V_T$ above the other transistor's base terminal voltage, current will flow predominately through the transistor having the higher base terminal voltage. Typically, a difference of voltage of 2 to 3 $V_T$ (about 50 to 75 millivolts at room temperature) will switch the current almost entirely to the higher biased side of the differential pair. In general, this is substantially less than the first threshold voltage of the window comparator 10. Thus, as the difference between input voltages VX 12 and VY 14 is increased to approach the first voltage threshold, first differential pair 22 will already be conducting a current of very nearly I and second differential pair 28 will virtually not be conducting a current. In turn, this indicates that as window comparator 10 approaches the first threshold voltage difference between input voltages VX 12 and VY 14, the voltage at the collector terminal of transistor 24 will control the voltage at input ix 18 and the voltage at the collector terminal of transistor 22 will control the voltage at input iy 20 of comparator 16.

The voltage at a node 42 biases the base terminal of transistor 26 in differential pair 22. Node 42 lies on a lead or branch 44 coupling the Vcc voltage to a current source 46 of value I (the same value as current source 38). Similarly, the voltage at a node 48 biases the base terminal of transistor 24 in differential pair 22. Node 48 lies on a branch 50 coupling the Vcc voltage to a current source 52 of value I, again the same value as current source 38. A resistor 54 of value R and a resistor 56 of value R/2 lies between node 42 and Vcc on branch 44. R is an arbitrary resistance value as will be explained further herein. Branch 50 is analogous except that node 48 lies between a resistor 58 of value R and a resistor 60 of value R/2. Between node 42 and current source 46, branch 44 includes a bipolar NPN transistor 62 whose base terminal is biased by input voltage VY 14. Between a node 64 on branch 50 and current source 52, branch 50 includes a bipolar NPN transistor 66 (matched to transistor 62) whose base terminal is biased by input voltage VX 12. Transistors 66 and 62 form a different type of differential pair as in, for example, differential pair 22, because a resistor 68 of value 3.5 R couples the emitter terminals of transistors 66 and 62 such that transistors 66 and 62 form a differential pair with emitter degeneration. Thus, a difference of just a few multiples of VT between input voltages VX 12 and VY 14 will not have such a dramatic current steering effect as in, e.g., third differential pair 40. The difference in voltage will still steer current to the transistor 66 or 62 having its base terminal biased higher in voltage, just not to the degree as discussed before.

Because transistors 66 and 62 form a differential pair, if input voltages VX 12 and VY 14 are equal, transistors 66 and 62 each carry a current I set by their respective current sources 52 and 46. The state when transistors 66 and 62 each conducts a current I will be denoted as the equilibrium condition. At the equilibrium condition, the voltage at node 48 will be lower than Vcc by a drop of I*R/2. The voltage at node 42 will have three times this drop with respect to Vcc because the total resistance between node 42 and Vcc is (3/2)*R, which is three times the resistance between node 48 and Vcc (R/2). At the equilibrium condition (VX 12=VY 14), the voltage at node 48 is greater than the voltage at node 42 by several multiples of $V_T$. Therefore, transistor 24 (whose base terminal is biased by the voltage at node 48) will conduct virtually all the current with respect to transistor 26 (whose base terminal is biased by the voltage at node 42) in differential pair 22. The collector terminal of transistor 24 couples at node 72 to a resistor 70 of value R, which in turn couples to Vcc. The collector terminal of transistor 26 couples at node 74 to resistor 76 of value R, which also couples to Vcc. In addition, in second differential pair 28, node 74 couples to the collector terminal of transistor 30 and node 72 couples to the collector terminal of transistor 32. Analogous to differential pair 22, transistor 32 has a higher bias voltage when in the equilibrium condition than the bias voltage for transistor 30, indicating that transistor 30 will not be conducting at this point. Thus, the voltage at node 74 is at Vcc. However, node 72 drops below Vcc by an amount I*R at the same time because each transistor 24 and 32 conducts a current of I/2. As discussed previously, node 72 couples to input ix 17 and node 74 couples to input iy 19 of comparator 16. Accordingly, in the equilibrium condition, the voltage difference between inputs ix 17 and iy 19 will be negative. Comparator 16 has a high gain (greater than 1000) such that as the voltage at input iy 19 becomes just a fraction of a millivolt higher than the voltage at input ix 17, comparator 16 will saturate at its low state (VX 18 minus VY 20 equaling −300 millivolts). Accordingly, when input voltages VX 12 and VY 14 are equal, the difference between output voltages VX 18 and VY 20 is −300 millivolts, indicating that comparator 16 is in the low binary state.

As input voltage VX 12 is increased a few $V_T$ with respect to input voltage VY 14, differential pair 22 conducts virtually all the current I supplied to current source 38 as discussed before. Because transistors 66 and 62 form a differential pair with emitter degeneration, the current I supplied by current source 46 will gradually steer from transistor 62 to transistor 66 as input voltage VX 12 continues to increase with respect to input voltage VY 14. As input voltage VX 12 does so, the voltage at node 48 will continue to drop as more and more current above the equilibrium value of I flows through transistor 66. At the same time, the voltage at node 42 will continue to rise as less and less current flows through transistor 62. When the voltages at nodes 48 and 42 are equal, the same amount of current conducts through transistors 24 and 26, making the voltages at nodes 72 and 74 equal because equal amounts of current (I/2) flows through resistors 70 and 76 (note that virtually no current is being conducted by second differential pair 28 so it does not influence these voltages). At this point, the voltages at inputs ix 17 and iy 19 to comparator 16 will be equal. Therefore, the voltage at input ix 17 will eventually equal the voltage at input iy 19 of comparator 16 as input voltage VX 12 is increased with respect to input voltage VY 14. At this point, comparator 16 is just about to transition to the high binary state where the difference between output voltages VX 18 and VY 20 will equal 300 millivolts. Thus, the difference between input voltages VX 12 and VY 14 equals the first threshold voltage when the voltages at nodes 48 and 42 (and hence at inputs ix 17 and iy 19) are the same.

The emitter terminal of transistor 66 couples to resistor 68 at a node 78. Similarly, the emitter terminal of transistor 62 couples to resistor 68 at a node 80. Assuming the base-to-emitter voltages for transistors 66 and 62 are constant and equal, a voltage difference between input voltages VX 12 and VY 14 will also appear across resistor 68 between nodes 78 and 80. Thus, as the difference between input voltages VX 12 and VY 14 increases to equal the first threshold voltage, this threshold voltage will be impressed across resistor 68. At this point, the voltage at node 78 is more positive than the voltage at node 80 by the first threshold voltage (ignoring small differences between the base-to-emitter voltages in transistors 66 and 62). This means that a current of the first threshold voltage ($V_{TH1}$) divided by 3.5 R flows from transistor 66 to node 80 in addition to the current of value I that flows from transistor 66 to current source 52. Accordingly, a current of I+$V_{TH1}$/3.5R flows through transistor 66 when the difference between input voltages VX 12 and VY 14 equals $V_{TH1}$. By Ohm's law, the voltage at node 48 will then equal Vcc minus $0.5R*(I+V_{TH1}/3.5R)$. Because the current through transistor 62 will diminish by the same amount that the current increases at node 78, the voltage at node 42 will equal Vcc minus $3.5R*(I-V_{TH1}/3.5R)$. Setting these two expressions for the voltages at nodes 48 and 42 equal to one another allows for the determination of $V_{TH1}$ as a function of R and I as given by the following:

$$Vcc-0.5R*(I+V_{TH1}/3.5R)=Vcc-3.5R*(I-V_{TH1}/3.5R) \text{ Thus, } V_{TH1}=(3.5R)*(I/2) \quad (1)$$

Figure 2:
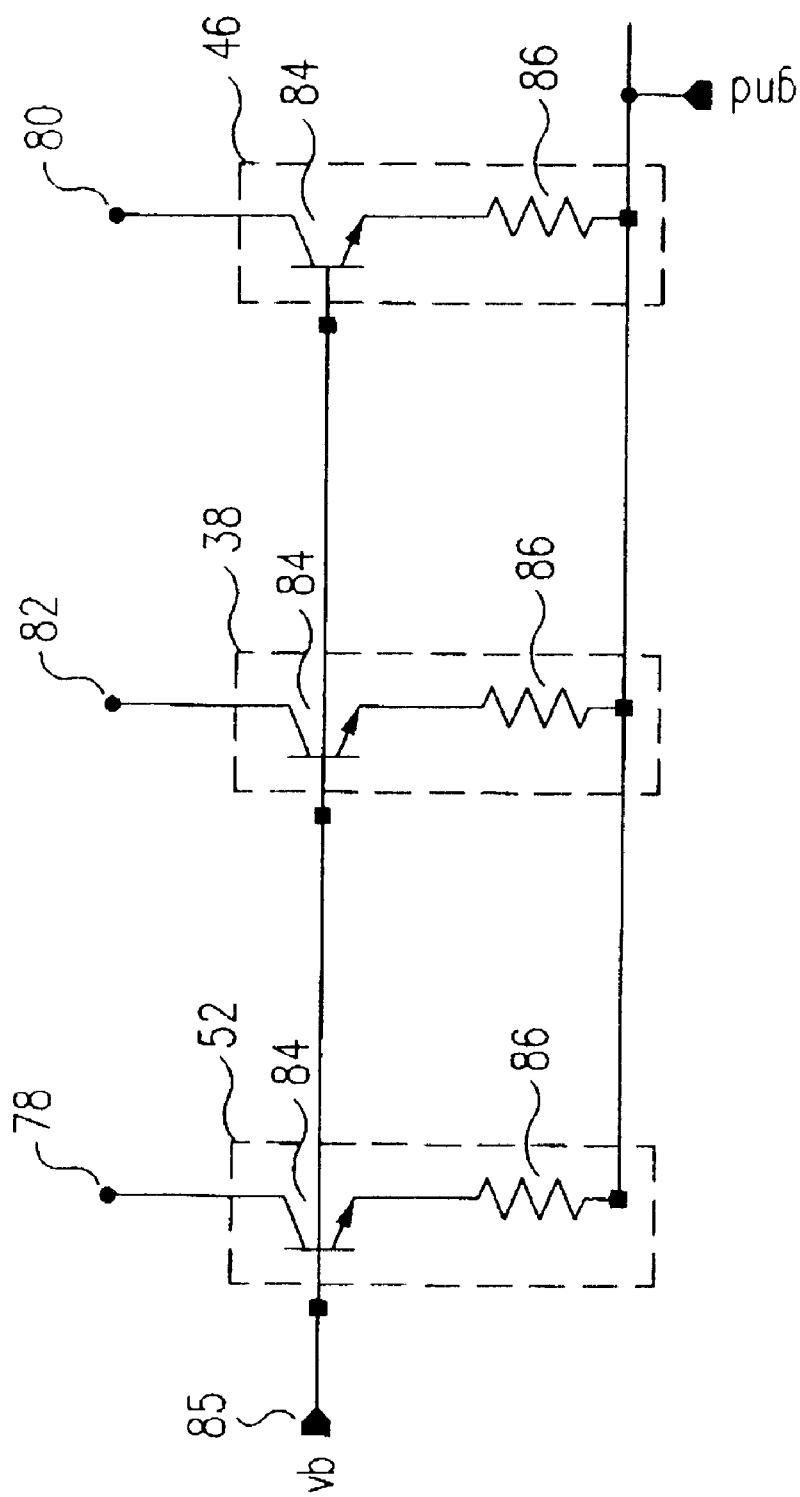
FIG. 2 is a schematic illustrating a bipolar NPN transistor embodiment for the current sources of FIG. 1.

Current value I depends upon the identical current sources 52, 38, and 46. Turning now to FIG. 2, each current source 52, 38, and 46 may comprises a matched bipolar NPN transistor 84 biased by a voltage Vb at node 85 whose emitter terminal couples to ground through a resistor 86 of resistance R. As will be explained further herein, voltage Vb may be set such that the current through each transistor 84 is a fixed voltage divided by the resistance R. Note that the current through each resistor 86 will be (Vb minus the base-to-emitter voltage (Vbe)) divided by the resistance R. A convenient value for this current is a fraction of the bandgap voltage divided by the resistance value R. A typical value for the bandgap voltage is 1.2 volts. Setting the fraction at $¼^{th}$ means the current drawn by each current source 52, 38, and 46 is 0.3/R. Thus, the voltage Vb equals Vbe plus 0.3. The value of I=0.3/R may now be entered in equation (1) to give a value for $V_{TH1}$ of 0.525.

Note that because of the symmetries in window comparator 10 illustrated in FIG. 1, an analogous result occurs when the difference between input voltages VX 12 and VY 14 equals the second threshold voltage ($V_{TH2}$) as follows. When the equilibrium condition is passed as input voltage VY 14 becomes greater than input voltage VX 12, the current I drawn by current source 38 will steer to transistor 36 in third differential pair 40. Thus, as input voltage VY 14 becomes !more positive than input voltage VX 12 by a few multiples of $V_T$, second differential pair 28 conducts almost the entire current I supplied by current source 38 while first differential pair 22 conducts almost no current. The base terminal of transistor 32 couples to node 87, which in turn couples through resistor 56 having a value of R/2 to Vcc. Analogous to first differential pair 22, the base terminal of transistor 30 couples to node 64, which at the equilibrium condition will have a voltage drop with respect to Vcc three times that of the voltage drop at node 87 with respect to Vcc. Thus, as the input voltage VY 14 increases just slightly above input voltage VX 12, the voltage at node 74 at the collector terminal of transistor 30 will essentially equal Vcc whereas the voltage at node 72 at the collector terminal of transistor 32 will equal Vcc minus I*R. At this point, the comparator 16 will be in the low binary state. When the difference between input voltages VY 14 and VX 12 equals $V_{TH2}$, the voltages at nodes 64 and 87 will equal, thereby reaching a transition point for comparator 16. At the same time, the second threshold voltage will be impressed across resistor 68 such that the voltage at node 80 equals the voltage at node 78 plus $V_{TH2}$. Accordingly, a current of value $V_{TH2}/3.5R$ will then flow from node 80 to node 78. Because current source 46 must draw a current of value I, the current through transistor 62 must then be increased by an amount $V_{TH2}/3.5R$. By Ohm's law, the resulting voltage at node 87 will be Vcc minus $0.5*(I+V_{TH2}/3.5R)$. Similarly, the resulting voltage at node 64 will be Vcc minus $(3/2)*(I-V_{TH2}/3.5R)$. Setting these two expressions for the voltages at nodes 87 and 64 equal to one another allows for the determination of $V_{TH2}$ as a function of R and I as given by the following:

$$Vcc-0.5*(I-V_{TH2}/3.5R)=Vcc-(3/2)*(I+V_{TH2}/3.5R) \text{ Thus, } V_{TH2}=(3.5R)*(I/2) \quad (2)$$

Setting I =0.3/R into equation (2) analogously as with equation (1) gives $V_{TH2}$=0.525 volts. Note that the above calculation defined $V_{TH2}$ by the difference between input voltages VY 14 and VX 12. To be consistent with the first voltage threshold, which is defined as the difference between VX 12 and VY 14, the second threshold voltage must be reversed. Thus, as to be expected given the symmetries in window comparator 10, the second threshold voltage is simply the opposite of the first threshold voltage.

Figure 3:
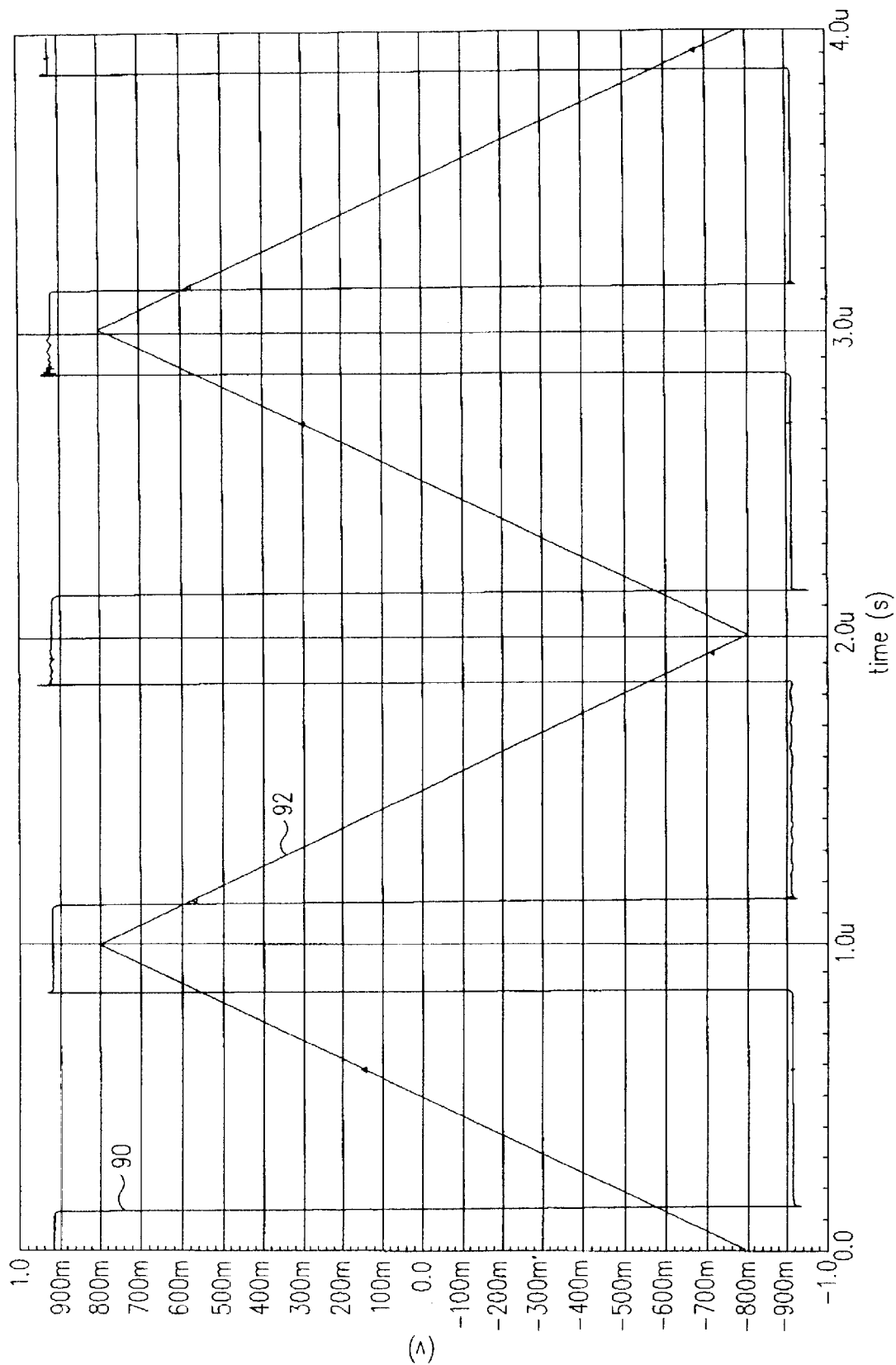
FIG. 3 is a timing diagram illustrating the relationships between a sawtooth patterned input voltage and the resulting output voltage for the window comparator of FIG. 1.

Turning now to FIG. 3, the output voltage value 90 (3*(VX 18−VY 20)) is plotted as a function of the differential input voltage 92 (VX 12−VY 14), where the differential input voltage is given a sawtooth waveform oscillating between a maximum voltage of 800 millivolts and a minimum of −800 millivolts in a period of 2 micro-seconds. The actual value of the output voltage (VX 18−VY 20) is multiplied by three arbitrarily so as to show the relationship between the positive and negative voltage thresholds and the binary state of the comparator 16. As can be seen from FIG. 3, should be the input voltage be between $V_{NTH}$ (−525 millivolts) and $V_{TH}$ (525 millivolts), the comparator state is low. If the input voltage is less than $V_{NTH}$ or greater than $V_{TH}$, the comparator state is high.

The preceding discussion assumes that transistors 84 in current sources 52, 38, and 46 as well as transistors 34, 36, 66, and 62 are not driven into a saturation mode. Should these transistors go into saturation, the assumptions made previously may become erroneous. Keeping these transistors in a linear mode sets limits on the maximum and minimum values input voltages VX 12 and VY 14 may assume as follows.

The base-to-emitter voltage Vbe for a bipolar transistor in a linear mode is typically about 0.85 volts. Keeping the minimum input voltages VX 12 and VY 14 at 2*Vbe means the voltages at nodes 78 and 80 will be Vbe because each transistor 66 and 62 will introduce a voltage drop of Vbe at their emitter terminals with respect to the voltage at their base terminals (which equals the respective input voltages VX 12 or VY 14). In this fashion, transistors 84 in current sources 52, 38, and 46 cannot enter saturation assuming the biasing voltage Vb (FIG. 2) does not go above (Vbe+0.3) volts.

In practice, the collector voltage may swing approximately 300 millivolts below the base voltage in a bipolar NPN transistor before it enters saturation. Thus, the maximum value for input voltage VX 12 is 300 millivolts above the minimum voltage value realized at node 64. Similarly, the maximum value for input voltage VY 14 (VXmax) is 300 millivolts above the minimum voltage value realized at node 42. These maximum voltage values are the same given the symmetry of window comparator 10. When input voltage VY 14 is at its maximum value, then node 42 is at its minimum voltage. At the same time, VX 12 will have its minimum value of 2Vbe. Resistor 68 will then conduct a current of (Vxmax−2Vbe)/3.5R. The minimum voltage value for node 42 is thus given by Vcc−(3/2)R*(I+(VXmax−2Vbe)/3.5R). The following equation then allows the solution for VXmax/VYmax:

$$VXmax-[Vcc-(3/2)R*(I+(VXmax-2Vbe)/3.5R)]=0.3 \quad (3)$$

Using a value for Vcc of 3.3 volts, R=5740Ω, I=55 μA, and Vbe=0.85 volts in equation (3) gives the maximum value for input voltage VX 12 (and by symmetry for input voltage VY 14) of 2.698 volts.

Finally, the resistance of resistor 68 is not arbitrary and must be chosen as follows. The maximum amount of current that can be steered from transistor 62 to transistor 66 (or vice versa) is determined by the value of I, the current drawn by current sources 52, 38, and 46. When the difference between input voltages VX 12 and VY 14 equals $V_{TH1}$, the steered current through resistor 68 is $V_{TH1}/3.5R$. As the difference between input voltages VX 12 and VY 14 goes from just under $V_{TH1}$ to just over $V_{TH1}$, the current steering process must be active. For example, suppose that the resistance of 3.5R for resistor 68 is chosen such that when the difference between input voltages VX 12 and VY 14 is $V_{TH1}/2$, the current through resistor 68 is already equal to I. In this case, as the difference between VX 12 and VY 14 increases past $V_{TH1}/2$, no additional current can be steered through resistor 68 because it was already conducting a current of I. Thus, window comparator 10 would interpret voltages greater than $V_{TH1}/2$ as if it were equal to $V_{TH1}/2$. Given the values for $V_{TH1}$, $V_{TH2}$, I, and R previously discussed, setting resistor 68 at a resistance of 3.5R sets a current of only I/2 through resistor 68 at the threshold voltages.

The resulting performance of window comparator 10 is advantageous in that both differential pairs 22 and 28 are fully differential with respect to their input voltages, giving beneficial common-mode noise immunity. In addition, only a single comparator is necessary, providing a compact design and eliminating the extra transistors necessary in window comparators requiring two separate comparators.

Although the embodiment discussed with respect to FIGS. 1 through 3 uses bipolar NPN transistors, a design using bipolar PNP transistors may be readily implemented, assuming the proper voltage levels are implemented. In addition, the bipolar NPN transistors may be replaced by CMOS n-channel or p-channel transistors. In such a case, the resistors 86 (FIG. 2) for current sources 52, 38, and 46 would be unnecessary.

Accordingly, although the invention has been described with respect to illustrative embodiments, other embodiments of the invention will be apparent to persons skilled in the art. Thus, the scope of the invention is defined only by the following claims.

I claim:

1. A window comparator having a first input voltage and a second input voltage, comprising:

a first differential pair of transistors;

a second differential pair of transistors, wherein the transistors in the first differential pair of transistors are biased to each conduct a first current and the transistors in the second differential pair of transistors are biased to conduct substantially no current when the difference between the first input voltage and the second input voltage equals a positive voltage threshold, and wherein the transistors in the second differential pair of transistors are each biased to each conduct a second current and the transistors in the first differential pair of transistors are biased to conduct substantially no current when the difference between the first input voltage and the second input voltage equals a negative voltage threshold; and a zero-crossing comparator having a first input coupled to a terminal on a first transistor in the first and second differential pairs of transistors and a second input coupled to a terminal on a second transistor in the first and second differential pairs of transistors.

2. The window comparator of claim 1, wherein the first current equals the second current.

3. The window comparator of claim 2, wherein the first and second transistors in the first and second differential pairs are matched bipolar transistors.

4. The window comparator of claim 3, wherein the matched bipolar transistors are NPN transistors.

5. The window comparator of claim 3, wherein the matched bipolar transistors are PNP transistors.

6. The window comparator of claim 2, wherein the first and second transistors in the first and second differential pairs are matched FET transistors.

7. The window comparator of claim 6, wherein the FET transistors are n-channel transistors.

8. The window comparator of claim 6, wherein the FET transistors are p-channel transistors.

9. The window comparator of claim 3, wherein the first terminals of the first and second transistors in the first and second differential pairs are collector terminals.

10. The window comparator of claim 7, wherein the first terminals of the first and second transistors in the first and second differential pairs are gate terminals.

11. The window comparator of claim 1, wherein the negative voltage threshold equals the opposite of the positive voltage threshold.

* * * * *